(12) United States Patent
Gao et al.

(10) Patent No.: US 10,593,796 B2
(45) Date of Patent: Mar. 17, 2020

(54) LATERAL INSULATED-GATE BIPOLAR TRANSISTOR AND METHOD THEREFOR

(71) Applicant: NXP USA, INC., Austin, TX (US)

(72) Inventors: Zihao M. Gao, Gilbert, AZ (US); Christopher Paul Dragon, Tempe, AZ (US); Walter Sherrard Wright, Chandler, AZ (US)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 15/840,426

(22) Filed: Dec. 13, 2017

(65) Prior Publication Data

US 2019/0181262 A1     Jun. 13, 2019

(51) Int. Cl.

| | |
|---|---|
| *H01L 29/10* | (2006.01) |
| *H01L 29/739* | (2006.01) |
| *H01L 29/66* | (2006.01) |
| *H01L 29/78* | (2006.01) |
| *H01L 21/02* | (2006.01) |
| *H01L 29/423* | (2006.01) |
| *H01L 29/08* | (2006.01) |
| *H01L 27/07* | (2006.01) |

(52) U.S. Cl.
CPC .... *H01L 29/7818* (2013.01); *H01L 21/02123* (2013.01); *H01L 27/0716* (2013.01); *H01L 29/0808* (2013.01); *H01L 29/0821* (2013.01); *H01L 29/1033* (2013.01); *H01L 29/1095* (2013.01); *H01L 29/42384* (2013.01); *H01L 29/66325* (2013.01); *H01L 29/7393* (2013.01); *H01L 29/7395* (2013.01); *H01L 29/7398* (2013.01)

(58) Field of Classification Search
CPC ........... H01L 29/66325; H01L 29/7393; H01L 29/7395; H01L 29/1095
See application file for complete search history.

(56) References Cited

U.S. PATENT DOCUMENTS

| | | | | |
|---|---|---|---|---|
| 5,105,243 | A  * | 4/1992 | Nakagawa | .......... H01L 29/0696 257/212 |
| 6,191,456 | B1 | 2/2001 | Stoisiek et al. | |
| 9,070,735 | B2 | 6/2015 | Pathirana et al. | |
| 2011/0241069 | A1 * | 10/2011 | Vashchenko | ........ H01L 27/0262 257/140 |
| 2016/0343851 | A1 * | 11/2016 | Gao | ..................... H01L 29/0623 |

FOREIGN PATENT DOCUMENTS

JP      4725040 B2      7/2011

* cited by examiner

*Primary Examiner* — Phat X Cao

(57) ABSTRACT

A transistor includes a substrate of a first conductivity type. An epitaxial layer of the first conductivity type is formed at a top surface of the substrate. A first region of the first conductivity type is formed as a well in the epitaxial layer. A second region of a second conductivity type is formed as a well in the epitaxial layer adjacent to the first region and the second conductivity type is opposite of the first conductivity type. A third region of the second conductivity type is formed in the first region and a portion of the first region forms a channel region between the third region and the second region. An emitter region of the first conductivity type is formed in the second region. A gate dielectric is formed over the channel region, and a gate electrode is formed on gate dielectric with the gate electrode overlapping at least a portion of second region and the third region.

17 Claims, 3 Drawing Sheets

LATERAL INSULATED-GATE BIPOLAR TRANSISTOR AND METHOD THEREFOR

BACKGROUND

Field

This disclosure relates generally to semiconductor devices, and more specifically, to a lateral insulated-gate bipolar transistor (LIGBT) and method of forming the same.

Related Art

Today, many semiconductor devices include power transistors which are used in a variety of applications and electronic products—from cellular base station amplifiers to magnetic resonance imaging (MRI) equipment, from electric vehicles (EVs) to avionics, and so on. Such power transistors are expected to be tolerant of high voltages and high currents. As process technology progresses, semiconductor devices are expected to reduce in size and cost while increasing performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Many of today's smart RF power technologies have led to laterally diffused metal oxide semiconductor (LDMOS) transistors as preferred power transistors for RF applications. With LDMOS transistors, extremely long drift regions are required to achieve breakdown voltage targets. Such long drift regions, however, cause high drain-source on resistance and high output capacitance which have a negative impact on power density and efficiency.

Generally, there is provided, a lateral insulated-gate bipolar transistor (LIGBT) structure for radio frequency (RF) applications. Features from field effect transistors (FETs) and bipolar junction transistors (BJTs) are combined in a Darlington configuration to form a basic structure of the LIGBT. An emitter region of the LIGBT is formed as a very shallow P++ region in an N-type high voltage body region. By forming this P-N structure in the emitter region, higher current densities can be attained with lower output capacitance. In turn, efficiency and power density is improved during RF operations. A backside collector terminal is formed in the LIGBT structure to facilitate RF packaging.

Figure 1:
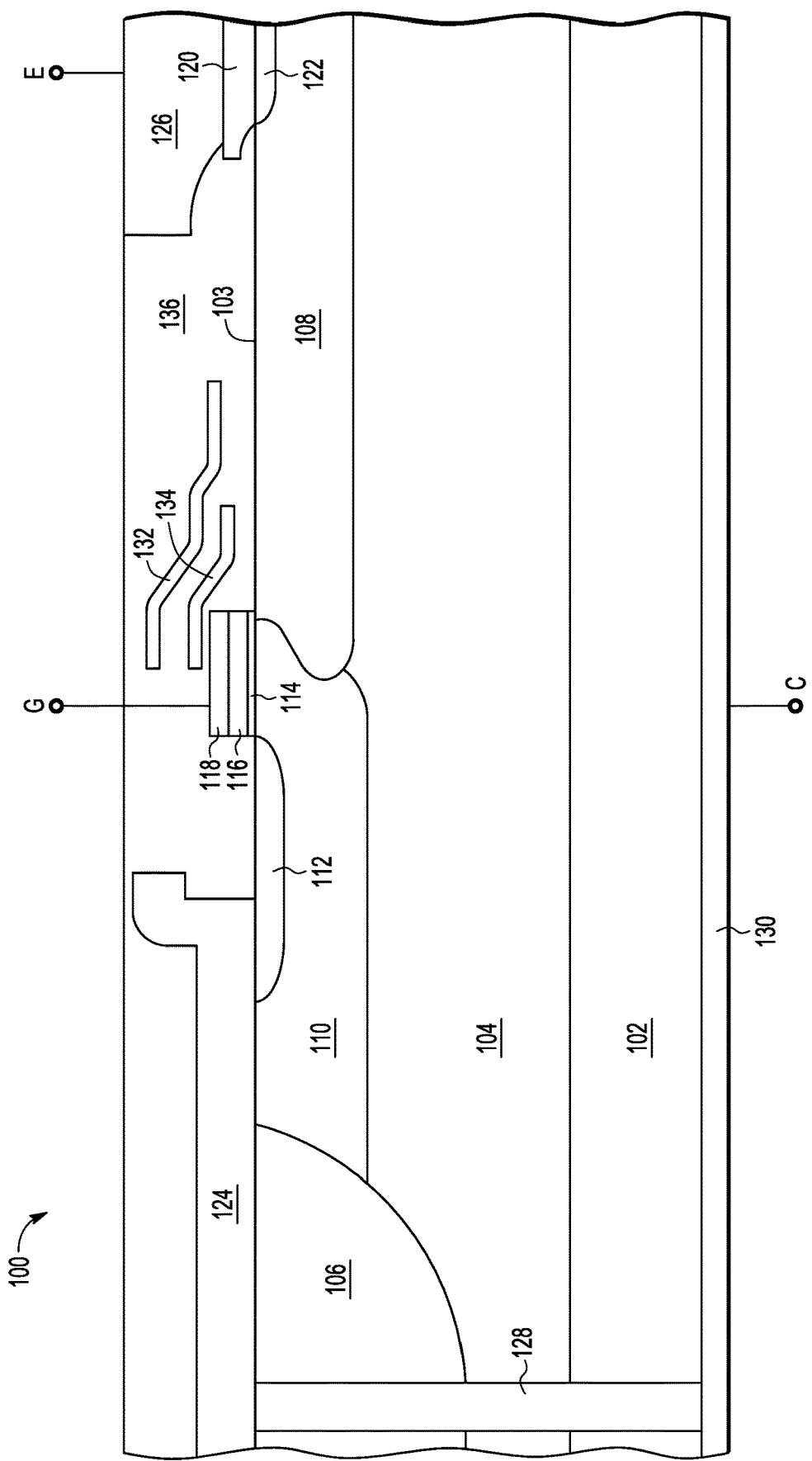
FIG. 1 illustrates, in simplified cross-sectional view, an exemplary lateral insulated-gate bipolar transistor (LIGBT) in accordance with an embodiment of the present invention.

FIG. 1 illustrates, in simplified cross-sectional view, an exemplary lateral insulated-gate bipolar transistor (LIGBT) 100 in accordance with an embodiment of the present invention. Exemplary LIGBT 100 includes a silicon based substrate 102 and an epitaxial (EPI) layer 104 formed at a top surface 103 of substrate 102. In this embodiment, substrate 102 is formed as a P-type (e.g., P+ doped) substrate and EPI layer 104 is formed as a P-type (e.g., P– doped) layer having a same conductivity type as substrate 102. Substrate 102 may be formed from other suitable silicon-based substrates such as gallium arsenide, silicon germanium, silicon, monocrystalline silicon, and the like, for example.

A P-type body region (e.g., high voltage P-well) 110 is formed at a top surface (103) of EPI layer 104. An N-type body region (e.g., high voltage N-well) 108 having a conductivity type opposite of the P-type body region 110 is formed adjacent to P-type body region 110 at the top surface of EPI layer 104. A P-type sinker region 106 is formed adjacent to P-type body region 110 at the top surface of EPI layer 104. P-type sinker region 106 is formed by implanting a high dose P+ dopant using high energy, and thermally driven to form an electrical connection with substrate 102. An N-type region (e.g., N+ doped region) 112 having a conductivity type opposite that of P-type body region 110 is formed at a top surface (103) of P-type body region 110. At least a portion of P-type body region 110 extends laterally surrounding the sides and bottom regions of the N-type region 112.

LIGBT 100 includes an insulated gate electrode (116, 118) formed on a gate dielectric 114. A gate dielectric layer is formed at top surface 103 and may be formed from any suitable dielectric material such as a grown or deposited oxide material. In this embodiment, the gate electrode is formed with two polysilicon layer depositions to form a first gate electrode portion 116 and a second gate electrode portion 118. In another embodiment, the gate electrode may be formed with one polysilicon layer deposition. Here, a first polysilicon layer is deposited over the gate dielectric layer to form the first gate electrode portion 116 on gate dielectric 114. After pattern and etch operations, first gate electrode portion 116 and gate dielectric 114 remain while other portions of the first polysilicon layer and gate dielectric layer are removed. In this embodiment, gate dielectric has a thickness in a range of 100 to 300 angstroms. In other embodiments, gate dielectric 114 may have thicknesses less than 100 angstroms or greater than 300 angstroms. A second polysilicon layer is deposited over the first gate electrode portion and exposed portions of top surface 103 to form the second gate electrode portion 118 and emitter electrode portion 120. After subsequent pattern and etch operations, second gate electrode portion 118 and emitter electrode portion 120 remain while other portions of the second polysilicon layer are removed. In this embodiment, a tungsten silicide layer is formed at a top surface of second gate electrode portion 118. Gate electrode portions 116 and 118 typically includes a polysilicon material but may be formed from other suitable conductive materials.

After the emitter electrode portion 120 is formed, a very shallow emitter region 122 is formed having a conductivity type opposite that of N-type body region 108. In this embodiment, the emitter electrode portion 120 is implanted with a dopant (e.g., boron) to form P++ doped polysilicon emitter portion 120. After forming P++ doped polysilicon emitter portion 120, an anneal operation (e.g., rapid thermal anneal (RTA) process) thermally drives the P++ doped polysilicon to diffuse into the N-type body region 108 forming the shallow P++ emitter region 122 at top surface 103. It is desirable to form emitter region as a very shallow region with very high doping concentrations to realize increased conduction currents. In another embodiment, emitter region 122 may be formed without forming emitter portion 120. By implanting a portion of the N-type body region 108 at top surface 103 with a P++ dopant (e.g., boron, indium), the shallow P++ emitter region 122 can be formed. In other embodiments, other process methods and techniques may be employed to form the shallow P++ emitter region 122.

A metallization layer is subsequently deposited over top surface 103 and over emitter portion 120. After pattern and etch operations, a first interconnect region 124 is formed electrically connecting N-type region 112 with P-type body region 110 and P-type sinker region 106, and a second interconnect region 126 is formed as an emitter electrode connection. The metallization layer may be formed as a multi-step process. In one step, forming a thin metal film (e.g., platinum) over exposed portions of N-type region 112, P-type body region 110, and P-type sinker region 106 to form a salicide contact region, and over exposed portion of emitter portion 120 to form a silicide contact region. In another step, forming a metallization layer over the salicide and silicide contact regions. First and second interconnect regions 124 and 126 may be formed from any suitable conductive material such as copper, gold, silver, aluminum, nickel, tungsten, and alloys thereof, for example. First and second interconnect regions 124 and 126 may be formed from the same metallization layer(s) or may be formed from different metallization layers.

A metallization layer is formed at a bottom surface of substrate 102 to form collector electrode backside conductor 130. Backside conductor 130 may be formed from any suitable conductive material such as copper, gold, silver, aluminum, nickel, tungsten, and alloys thereof, for example. In some embodiments, a through-silicon via (TSV) 128 may be used to form a conduction path between first interconnect region 124 and backside conductor 130. TSV 128 may be formed from any suitable conductive material such as copper, gold, silver, aluminum, nickel, tungsten, and alloys thereof, for example.

Still referring to the cross-sectional view of exemplary LIGBT 100, one or more shield plates (134, 132) are formed over a portion of gate electrode (116, 118) and over a portion of N-type body region 108. Shield plates 132 and 134 are formed by a metallization deposition on interlevel dielectric (ILD) layers (e.g., tungsten silicide). For example, first shield plate 134 is formed on an ILD layer covering gate electrode (116, 118) and a top portion of N-type body region 108, and second shield plate 132 is formed on an ILD layer covering at least first shield plate 134. Shield plates 132 and 134 shield coupling between gate and emitter regions of LIGBT 100 when grounded. Shield plates 132 and 134 also improve hot carrier injection (HCI) performance of LIGBT 100. In the embodiment depicted in FIG. 1, the various ILD layers are shown collectively as ILD region 136. The ILD layers forming ILD region 136 may be formed from any suitable dielectric material (e.g., deposited oxide such as tetraethyl orthosilicate (TEOS)).

Figure 2:
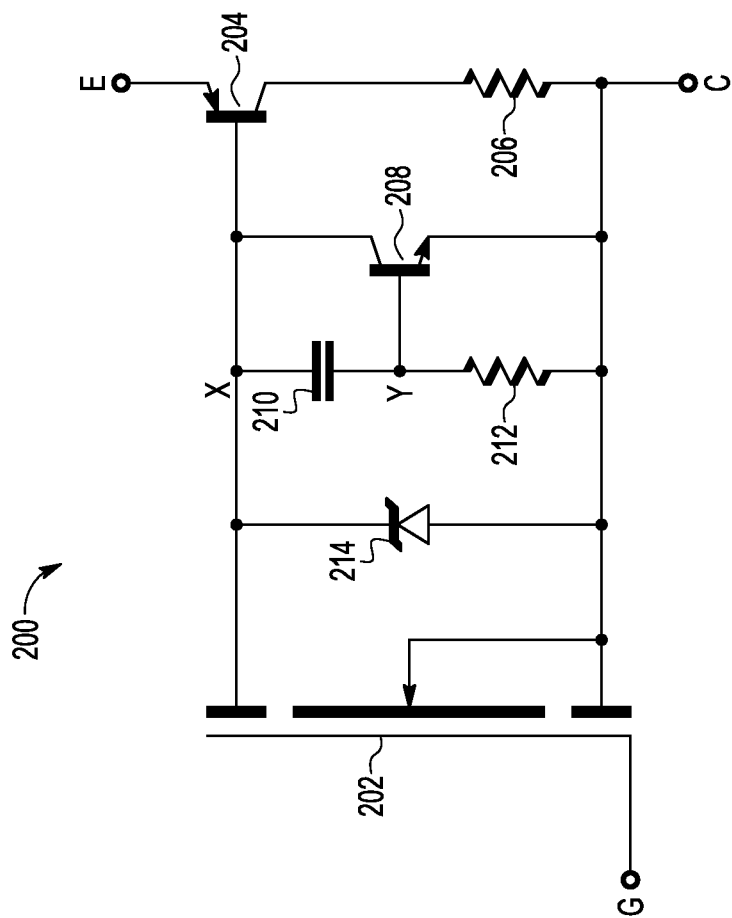
FIG. 2 illustrates, in simplified schematic diagram form, a circuit representation of the LIGBT depicted in FIG. 1 in accordance with an embodiment of the present invention.

FIG. 2 illustrates, in simplified schematic diagram form, a circuit representation 200 of the LIGBT 100 depicted in FIG. 1 in accordance with an embodiment of the present invention. The LIGBT 100 depicted in FIG. 1 is formed as a Darlington configuration of a field effect transistor (FET) and a bipolar junction transistor (BJT). Because the LIGBT 100 is formed in a Darlington configuration, a higher current gain is realized. The circuit representation 200 includes a gate terminal labeled G, an emitter terminal labeled E, and a collector terminal labeled C. Terminals G, E, and C of circuit 200 correspond to respective terminals labeled G, E, and C in LIGBT 100 of FIG. 1.

A field effect transistor (FET) 202 includes a gate electrode coupled to gate terminal G, source and body regions coupled to collector terminal C, and a drain region coupled to a base region of bipolar junction transistor (BJT) 204 at node labeled X. Gate electrode coupled to gate terminal G corresponds to gate portions 116 and 118. Source region of FET 202 coupled to collector terminal C corresponds to N-type region 112 and body regions of FET 202 coupled to collector terminal C correspond P-type body region 110, P-type sinker region 106, and substrate 102 in FIG. 1. Drain region of FET 202 coupled to the base region of BJT 204 at node X corresponds to N-type body region 108. An emitter region of BJT 204 is coupled at emitter terminal labeled E. The emitter region of BJT 204 corresponds to emitter region 122 of FIG. 1. A collector region of BJT 204 is coupled to collector terminal C by way of resistor 206. The collector region of BJT 204 corresponds to substrate 102 of FIG. 1 and resistor 206 corresponds to resistance of substrate 102 and EPI layer 104.

A parasitic BJT 208 coupled to FET 202 and BJT 204 includes a collector region at node X, an emitter region coupled at collector terminal C, and a base region coupled between parasitic capacitor 210 and parasitic resistor 212 at node labeled Y. The base region (node Y) of parasitic BJT 208 corresponds to the P-type body region 110 of FIG. 1. Parasitic capacitor 210 is representative of the capacitive interface between N-type body region 108 and P-type type body region 110 of FIG. 1, and parasitic resistor 212 is representative of body resistance including EPI layer 104 of FIG. 1. A parasitic body diode 214 is coupled between node X and collector terminal C. The body diode 214 is representative of the P-N junction formed with P-type EPI layer 104 and N-type body region 108 of FIG. 1.

Figure 3:
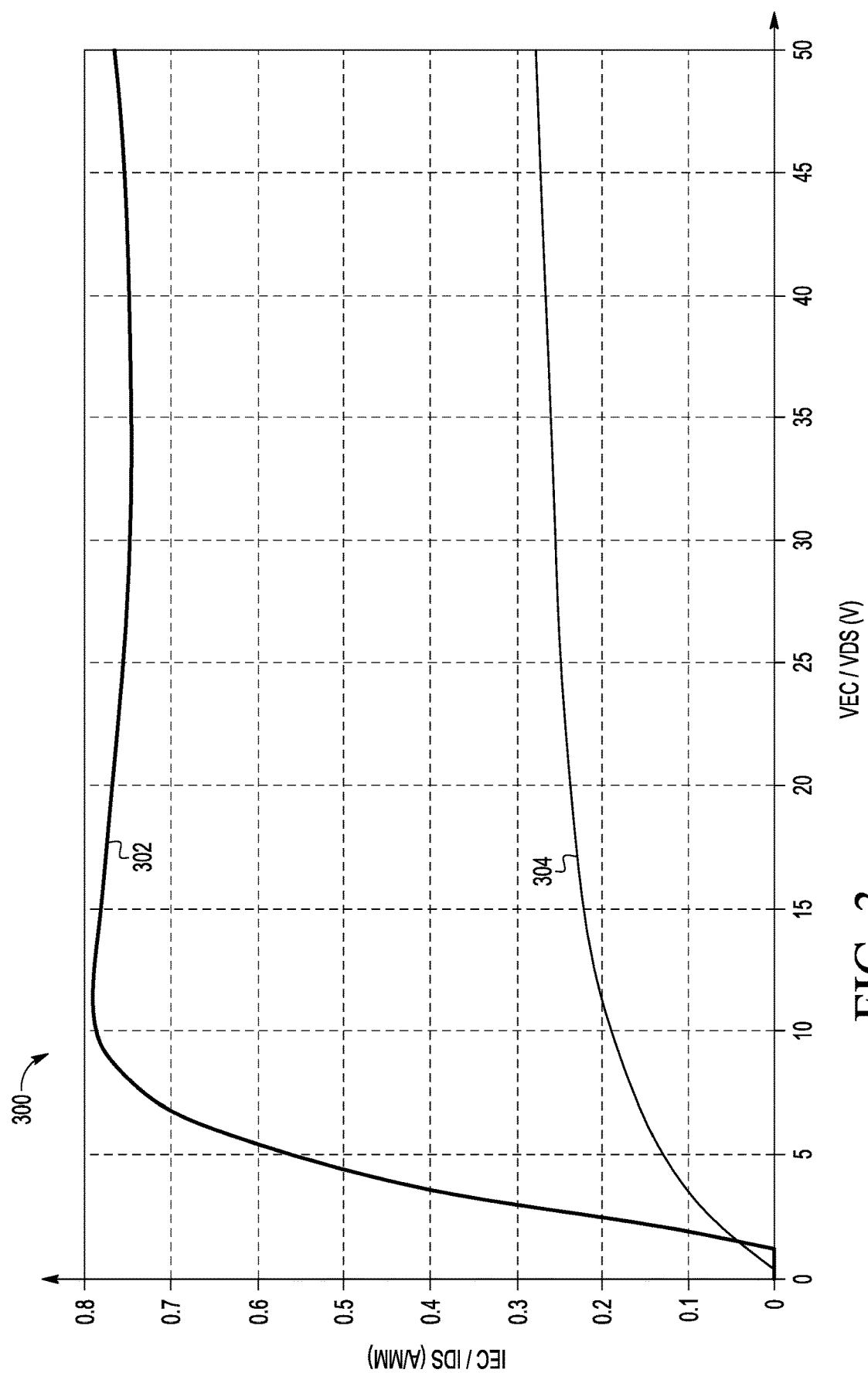
FIG. 3 illustrates, in plot diagram form, simulation results in accordance with an embodiment of the present invention.

FIG. 3 illustrates, in plot diagram form, example simulation results in accordance with an embodiment of the present invention. Plot diagram 300 includes plots depicting current density as a function of voltage for exemplary LIGBT 100 and a comparably sized laterally diffused metal oxide semiconductor (LDMOS) devices. LIGBT emitter-collector voltage (VEC) values and LDMOS drain-source voltage (VDS) values are shown in volts (V) on the X-axis, and corresponding LIGBT emitter-collector current density (IEC) values and LDMOS drain-source current density (IDS) values are shown in amps per millimeter (A/mm) on the Y-axis. Plot 300 includes plots 302 and 304 showing simulations results for LIGBT and LDMOS devices respectively. In this example, plot 302 shows the LIGBT device having significantly higher (e.g., 3-4 time higher) current density values than the comparably sized LDMOS device values shown in plot 304. Because emitter region of LIGBT 100 is formed as a very shallow P++ emitter region 122 in the N-type body region 108, the formed P-N structure (122, 108) allows for higher current densities with lower output capacitance. In turn, efficiency and power density is improved during RF operations.

Generally, there is provided, a transistor including a substrate of a first conductivity type; an epitaxial layer of the first conductivity type formed at a top surface of the substrate; a first region of the first conductivity type formed as a well in the epitaxial layer; a second region of a second conductivity type formed as a well in the epitaxial layer adjacent to the first region, the second conductivity type opposite of the first conductivity type; a third region of the second conductivity type formed in the first region, a portion of the first region forming a channel region between the third region and the second region; an emitter region of the first conductivity type formed in the second region; a gate dielectric formed over the channel region; and a gate electrode formed on gate dielectric, the gate electrode overlapping at least a portion of second region and the third region. The transistor may further include a sinker region of the first type to form an electrical connection between the first region and the substrate. The transistor may further include a first interconnect region formed to electrically connect the sinker region with the first region and the third region. The transistor may further include a conductive layer formed on the bottom side of the substrate to form a collector electrode connection. The gate electrode may be formed as a first gate electrode portion formed on the gate dielectric and a second gate electrode portion formed on the first gate electrode portion. The transistor may further include a polysilicon region formed over the emitter region, the polysilicon region implanted with a dopant of the first conductivity type. The transistor may further include a metal interconnect formed on the polysilicon region to form an emitter electrode connection. The transistor may further include a shield formed over at least a portion of the gate electrode and at least a portion of the second region. The shield may be formed by way of a tungsten silicide process.

In another embodiment, there is provided, a transistor including a substrate of a first conductivity type; an epitaxial layer of the first conductivity type located at a top surface of the substrate; a first well region of the first conductivity type located within the epitaxial layer; a second well region of a second conductivity type located within the epitaxial layer adjacent to the first well region, the second conductivity type opposite of the first conductivity type; a source region of the second conductivity type located within the first well region, a portion of the first well region forming a channel region between the source region and the second well region; an emitter region of the first conductivity type located within the second well region and laterally spaced from the channel region; a gate dielectric formed over the channel region; and a gate electrode formed on gate dielectric, the gate electrode overlapping at least a portion of second well region and the source region. The transistor may further include a sinker region of the first conductivity type to form an electrical connection between the first well region and the substrate. The transistor may further include a first interconnect region formed to electrically connect the sinker region with the first well region and the source region. The gate dielectric may be formed to have a thickness in the range of 100 to 300 angstroms. The transistor may further include a polysilicon region formed over the emitter region, the polysilicon region implanted with a dopant of the first conductivity type. A portion of the gate electrode may be formed when the polysilicon region is formed. The transistor may further include a shield formed over at least a portion of the gate electrode and at least a portion of the second well region and not over the emitter region. The first conductivity type may be characterized as a P-type conductivity type, and the second conductivity type may be characterized as an N-type conductivity type.

In yet another embodiment, there is provided, a method including forming an epitaxial layer of a first conductivity type at a top surface of a substrate; implanting a first region to form a first body region of the first conductivity type in the epitaxial layer; implanting a second region to form a second body region of a second conductivity type in the epitaxial layer adjacent to the first body region, the second conductivity type opposite of the first conductivity type; implanting a third region to form a source region of the second conductivity type in the first body region, a portion of the first body region forming a channel region between the source region and the second body region; forming an emitter region of the first conductivity type in the second body region; forming a gate dielectric over the channel region; and depositing a conductive material on the gate dielectric to form a gate electrode, the gate electrode overlapping at least a portion of second body region and the source region. The method may further include forming a sinker region of the first conductivity type to form an electrical connection between the first body region and the substrate; and forming a first interconnect region to electrically connect the sinker region with the first body region and the source region. Forming the emitter region of the first conductivity type may include forming a polysilicon region on a portion of the second body region; implanting the polysilicon region with a dopant to form a doped polysilicon region of the first conductivity type; and annealing to activate dopant in the doped polysilicon region causing the emitter region to be formed.

By now it should be appreciated that there has been provided, a lateral insulated-gate bipolar transistor (LIGBT) structure for radio frequency (RF) applications. Features from field effect transistors (FETs) and bipolar junction transistors (BJTs) are combined in a Darlington configuration to form a basic structure of the LIGBT. An emitter region of the LIGBT is formed as a very shallow P++ region in an N-type high voltage body region. By forming this P-N structure in the emitter region, higher current densities can be attained with lower output capacitance. In turn, efficiency and power density is improved during RF operations. A backside collector terminal is formed in the LIGBT structure to facilitate RF packaging.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A lateral insulated-gate bipolar transistor comprising:
a substrate of a first conductivity type;
an epitaxial layer of the first conductivity type formed at a top surface of the substrate;
a first region of the first conductivity type formed as a well in the epitaxial layer;

a second region of a second conductivity type formed as a well in the epitaxial layer adjacent to the first region, the second conductivity type opposite of the first conductivity type;

a third region of the second conductivity type formed in the first region, a portion of the first region forming a channel region between the third region and the second region;

an emitter region of the first conductivity type formed in the second region, the second region extends laterally from the emitter region to the channel region;

a gate dielectric formed over the channel region; and a gate electrode formed on the gate dielectric, the gate electrode overlapping at least a portion of the second region and the third region, wherein the first region extends laterally surrounding side regions and a bottom region of the third region, and the lateral insulated-gate bipolar transistor is formed as a Darlington configuration.

2. The transistor of claim 1, further comprising a sinker region of the first type to form an electrical connection between the first region and the substrate.

3. The transistor of claim 2, further comprising a first interconnect region formed to electrically connect the sinker region with the first region and the third region.

4. The transistor of claim 1, further comprising a conductive layer formed on the bottom side of the substrate to form a collector electrode connection.

5. The transistor of claim 1, wherein the gate electrode is formed as a first gate electrode portion formed on the gate dielectric and a second gate electrode portion formed on the first gate electrode portion.

6. The transistor of claim 1, further comprising a polysilicon region formed over the emitter region, the polysilicon region implanted with a dopant of the first conductivity type.

7. The transistor of claim 6, further comprising a metal interconnect formed on the polysilicon region to form an emitter electrode connection.

8. The transistor of claim 1, further comprising a shield formed over at least a portion of the gate electrode and at least a portion of the second region.

9. The transistor of claim 8, wherein the shield is formed by way of a tungsten silicide process.

10. A lateral insulated-gate bipolar transistor comprising:
a substrate of a first conductivity type;
an epitaxial layer of the first conductivity type located at a top surface of the substrate;
a first well region of the first conductivity type located within the epitaxial layer;
a second well region of a second conductivity type located within the epitaxial layer adjacent to the first well region, the second conductivity type opposite of the first conductivity type;
a source region of the second conductivity type located within the first well region, a portion of the first well region forming a channel region between the source region and the second well region;
an emitter region of the first conductivity type located within the second well region and laterally spaced from the channel region, the second well region extends laterally from the emitter region to the channel region;
a gate dielectric formed over the channel region; and
a gate electrode formed on the gate dielectric, the gate electrode overlapping at least a portion of the second well region and the source region, wherein the first well region extends laterally surrounding side regions and a bottom region of the source region, and the lateral insulated-gate bipolar transistor is formed as a Darlington configuration.

11. The transistor of claim 10, further comprising a sinker region of the first conductivity type to form an electrical connection between the first well region and the substrate.

12. The transistor of claim 11, further comprising a first interconnect region formed to electrically connect the sinker region with the first well region and the source region.

13. The transistor of claim 10, wherein the gate dielectric is formed to have a thickness in the range of 100 to 300 angstroms.

14. The transistor of claim 10, further comprising a polysilicon region formed over the emitter region, the polysilicon region implanted with a dopant of the first conductivity type.

15. The transistor of claim 14, wherein a portion of the gate electrode is formed when the polysilicon region is formed.

16. The transistor of claim 10, further comprising a shield formed over at least a portion of the gate electrode and at least a portion of the second well region and not over the emitter region.

17. The transistor of claim 10, wherein the first conductivity type is characterized as a P-type conductivity type, and the second conductivity type is characterized as an N-type conductivity type.

* * * * *